(12) United States Patent
Rinerson et al.

(10) Patent No.: US 7,330,370 B2
(45) Date of Patent: Feb. 12, 2008

(54) ENHANCED FUNCTIONALITY IN A TWO-TERMINAL MEMORY ARRAY

(75) Inventors: Darrell Rinerson, Cupertino, CA (US); Christophe Chevallier, Palo Alto, CA (US); Steven W. Longcor, Mountain View, CA (US); Edmond Ward, Monte Sereno, CA (US); Robert Norman, Blaine, WA (US)

(73) Assignee: Unity Semiconductor Corporation

( * ) Notice: Subject to any disclaimer, the term of this patent is extended or adjusted under 35 U.S.C. 154(b) by 278 days.

(21) Appl. No.: 11/021,600

(22) Filed: Dec. 23, 2004

(65) Prior Publication Data

US 2006/0028864 A1 Feb. 9, 2006

Related U.S. Application Data

(63) Continuation-in-part of application No. 10/895,218, filed on Jul. 20, 2004, now Pat. No. 7,075,817.

(51) Int. Cl.
G11C 11/00 (2006.01)
(52) U.S. Cl. ............ 365/158; 365/185.03; 365/185.09
(58) Field of Classification Search ................ 365/158, 365/185.03, 185.09, 200, 210
See application file for complete search history.

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 5,418,743 A * | 5/1995 | Tomioka et al. | 365/185.03 |
| 5,537,631 A * | 7/1996 | Wong et al. | 714/7 |
| 6,067,248 A * | 5/2000 | Yoo | 365/185.03 |
| 6,204,139 B1 | 3/2001 | Liu et al. | |
| 6,473,332 B1 | 10/2002 | Ignatiev et al. | |
| 6,531,371 B2 | 3/2003 | Hsu et al. | |
| 6,753,561 B1 | 6/2004 | Rinerson et al. | |
| 6,836,421 B2 | 12/2004 | Rinerson et al. | |
| 6,856,536 B2 | 2/2005 | Rinerson et al. | |
| 2003/0061560 A1 * | 3/2003 | Furukawa | 714/764 |

OTHER PUBLICATIONS

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

ISSCC 2003, 512Mb PROM with 8 Layers of Antifuse/Diode Cells, IEEE Catalog No. 03CH37414, Feb. 2003, Paper 16.4 pp. 284-285, 493.

Liu et al., "Electric-pulse-induce reversible resistance change effect in magnetoresistive films," Applied Physics Letters, vol. 76, No. 19, May 8, 2000, pp. 2749-2751.

(Continued)

Primary Examiner—Huan Hoang

(57) ABSTRACT

A memory array with enhanced functionality is presented. Each cell in the array includes a pair of memory element electrodes. A read current across the pair of memory element electrodes is indicative of stored information and different write voltage levels across the pair of memory element electrodes are employed to store nonvolatile information. The array has at least one enhanced functionality portion that performs operations selected from the group consisting of reference, error correction, device specific storage, defect mapping tables, and redundancy.

18 Claims, 11 Drawing Sheets

OTHER PUBLICATIONS

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

David Oxley, "Memory Effects in Oxide Films" in Oxides and Oxide Films, vol. 6, pp. 251-325 (Chapter 4) (Ashok. K. Vijh ed., Marcel Drekker) (1981).

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

J.G. Simmons and R.R. Verderber, "New Conduction and Reversible Memory Phenomena in Thin Insulating Films," Proc. Roy. Soc. A., 301 (1967), pp. 77-102.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped $SrTiO_3$ single crystals," Applied Physics Letters, vol. 78, No. 23, Jun. 4, 2001, pp. 3738-3740.

* cited by examiner

ENHANCED FUNCTIONALITY IN A TWO-TERMINAL MEMORY ARRAY

CROSS-REFERENCE TO RELATED APPLICATIONS

This application is a continuation-in-part of U.S. application Ser. No. 10/895,218, filed Jul. 20, 2004, now U.S. Pat. No. 7,075,817, titled "Two Terminal Memory Array Having Reference Cells," hereby incorporated by reference in its entirety and for all purposes.

BACKGROUND OF THE INVENTION

1. Field of the Invention

The present invention generally relates to re-writeable non-volatile computer memory and specifically relates to memory design and architecture.

2. Description of the Related Art

Most computers have four types of necessary hardware components: CPU (central processing unit), input device, output device and memory. The CPU executes programs (software) which tell the computer what to do. Input and output (I/O) devices allow the computer to communicate with the user and the outside world. Memory enables a computer to store, at least temporarily, data and programs.

There are many ways in which memory can be categorized. For example, whether the CPU can directly or indirectly access the memory is the distinction between primary and secondary storage and whether the CPU can access any portion of the memory at any time or whether the data must be read in sequence is the distinction between random access media and sequential access media. However, these distinctions are typically necessitated by the underlying technology of the memory.

For example, certain types of memory, such as magnetic tape, are better suited to sequential access media. Similarly, if the underlying technology of a memory allows for very fast access, but loses its data when power is turned off (volatile memory), it may be appropriate for primary storage, but not secondary storage. If the underlying technology allows only slow access, but is non-volatile, secondary storage may be more appropriate. Cost concerns will also drive a technology's implementation. For example, read only memory is used whenever data does not need to be changed because it is so cost effective.

There are continuing efforts to improve upon the various memory technologies.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least 8 $f^2$ for each memory cell, where f is the minimum feature size. However, not all memory elements require three terminals. If, for example, a memory element is capable of changing its electrical properties (e.g., resistivity or capacitance) in response to a voltage pulse, only two terminals are required. With only two terminals, a cross point array layout that allows a single cell to be fabricated to a size of 4 $f^2$ can be utilized.

Figure 1A:
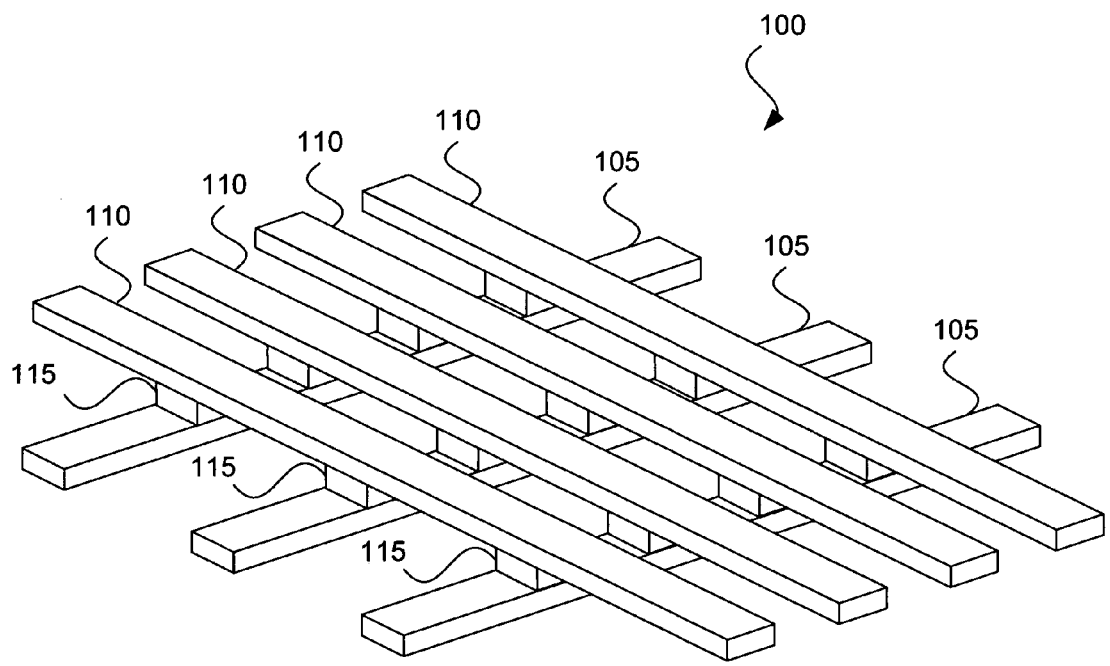
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 in order to modify the electrical properties of the memory plugs 115, and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
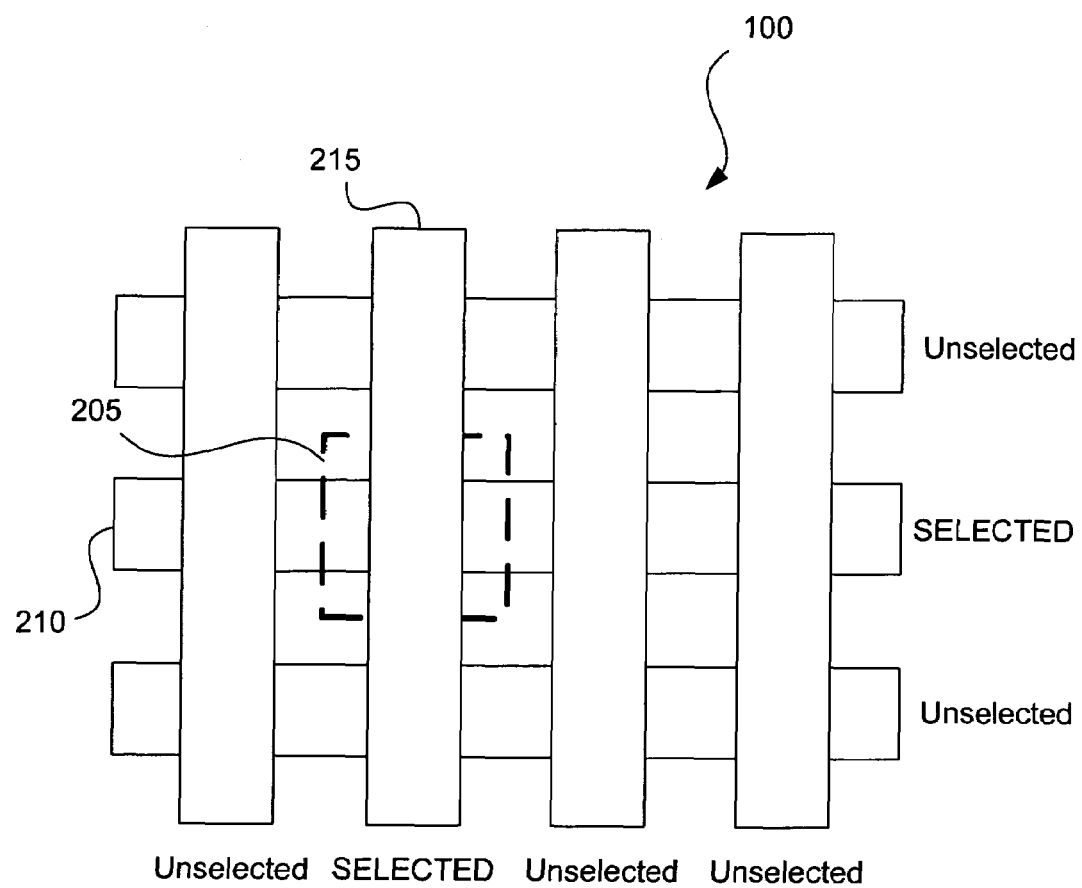
FIG. 2A depicts a plan view of selection of a memory cell in the exemplary cross point array depicted in FIG. 1A.
Figure 2B:
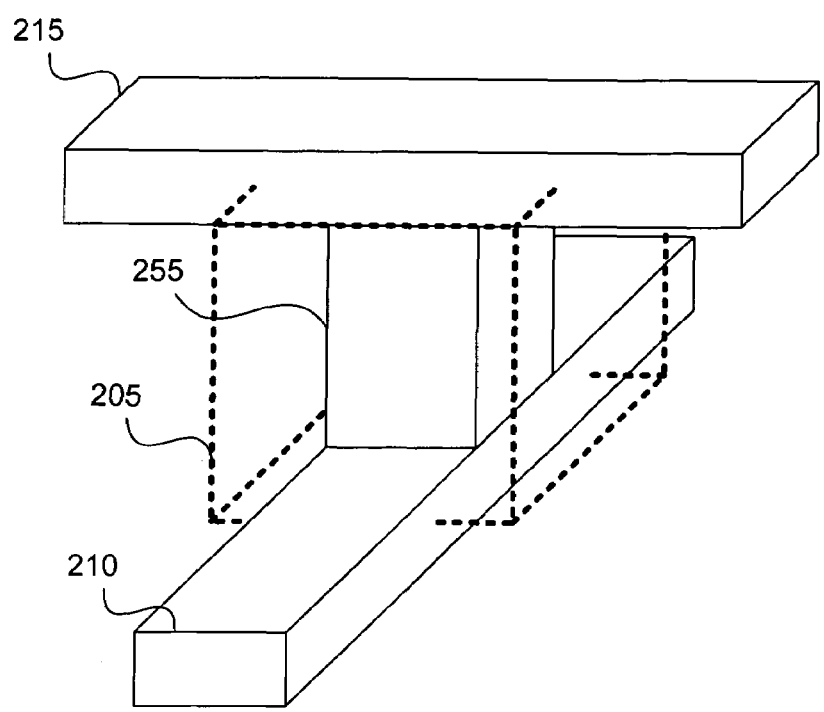
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
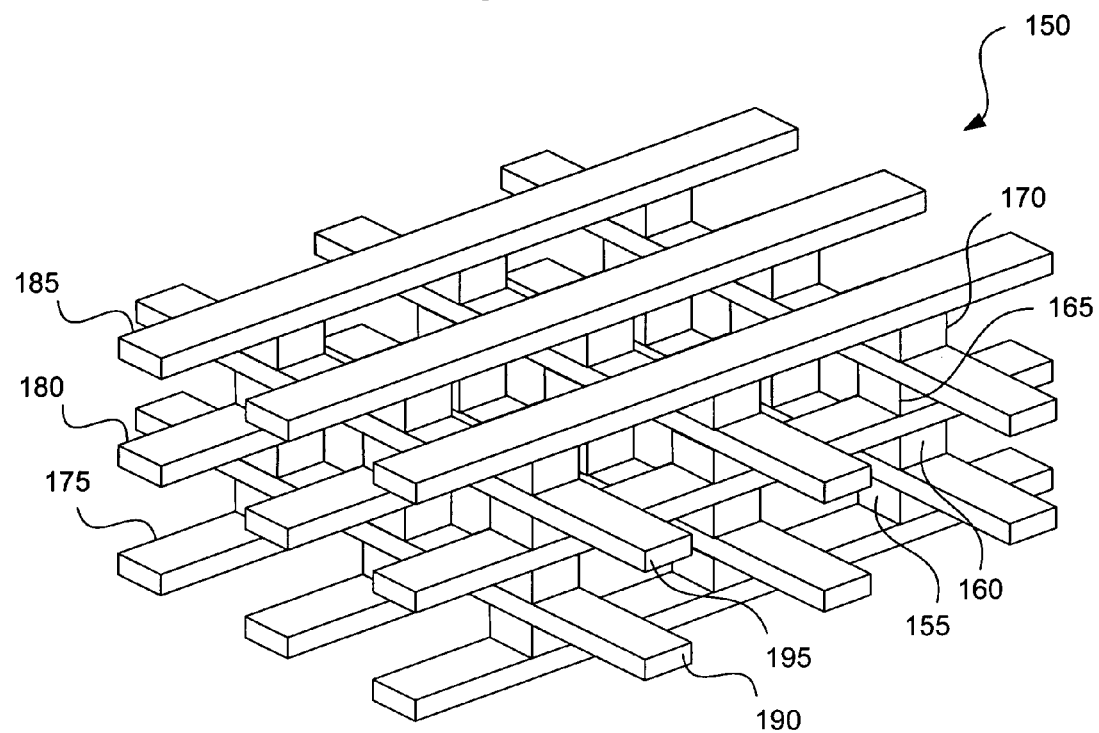
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top layer of conductive array lines and very bottom layer of conductive array lines (respectively, conductive array lines 185 and 175 in the example of FIG. 1B) would typically be fabricated to the same size as all other layers of conductive array lines even though they only use one surface. Of course, in an array where conductive array lines are not shared between memory layers, a memory cell would not only include both a top and a bottom conductive array line, but also ½ of the space in between the top conductive array line layer of one cell and the bottom conductive array line layer of the cell immediately above it.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element.

Figure 3:
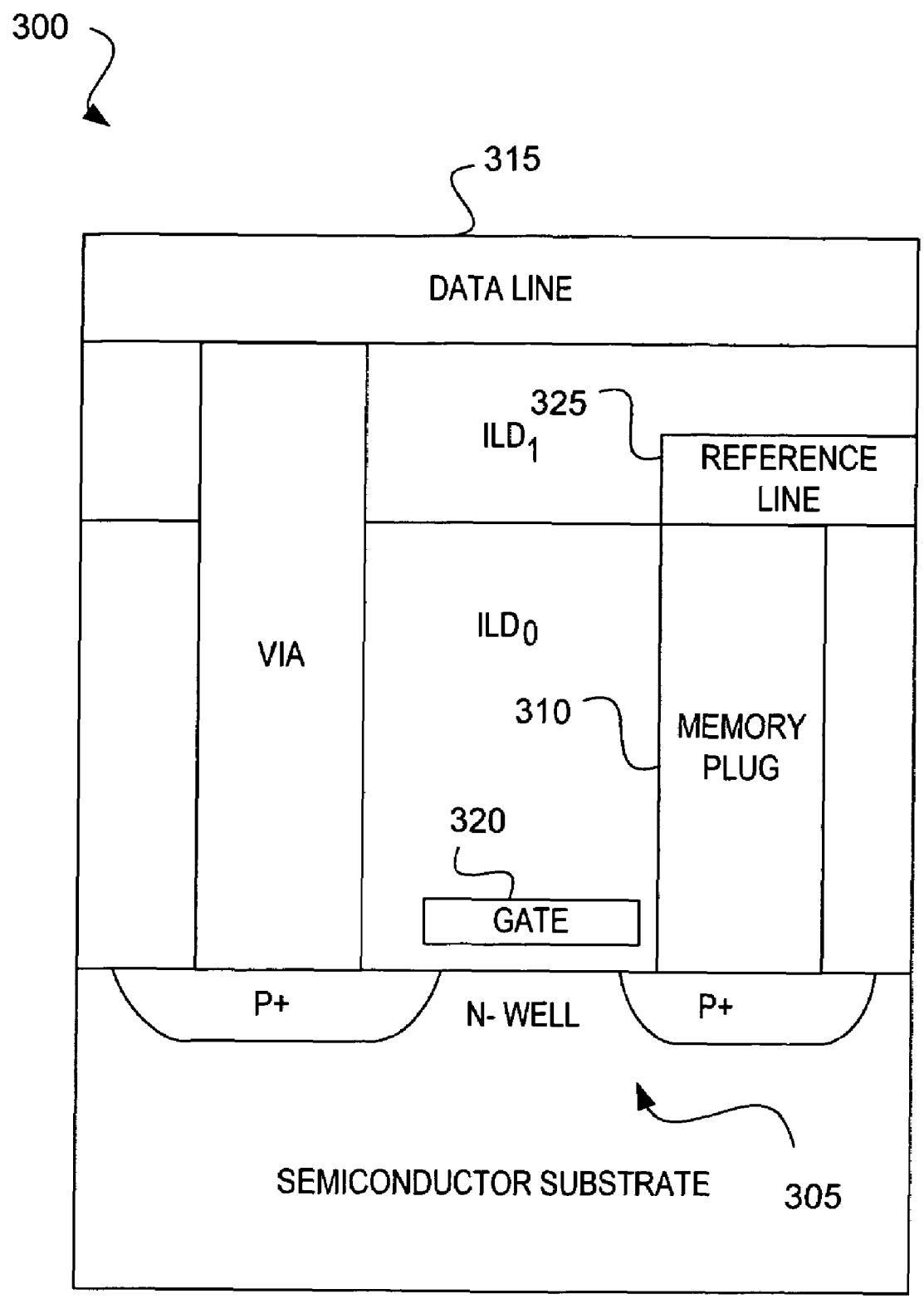
FIG. 3 depicts a generalized cross-sectional representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other. Although the entire memory cell 300 is a three-terminal device, the memory plug 310 is still a two-terminal device.

Memory Chip Configuration

Figure 4A:
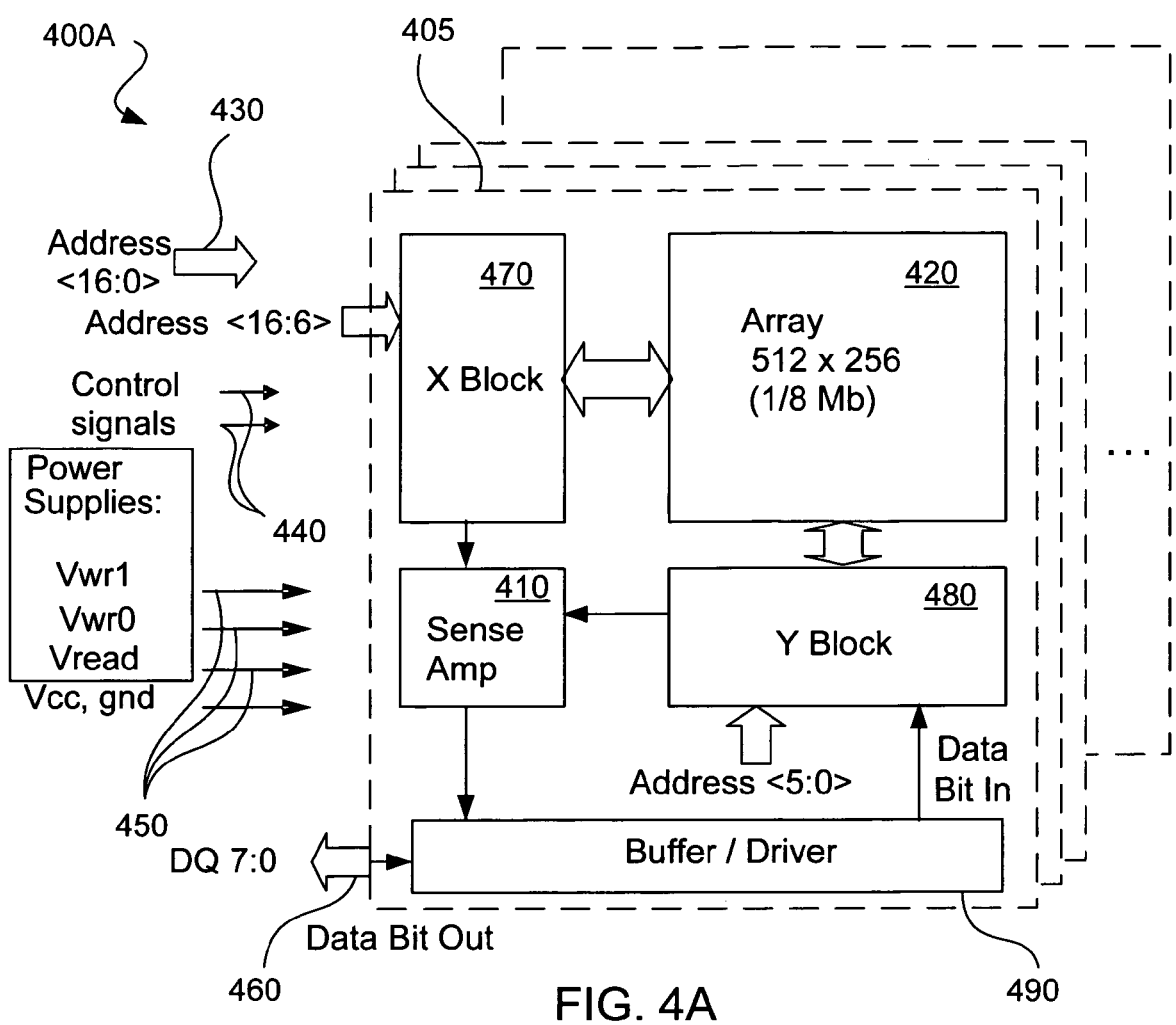
FIG. 4A depicts a block diagram of a representative implementation of an exemplary 1 MB memory.

FIG. 4A is a block diagram of a representative implementation of an exemplary 1 MB memory 400A. Physical layouts might differ, but the active circuitry of each memory bit block 405 would typically be formed on separate portions of a semiconductor substrate while each memory array layer 420 would be vertically stacked. Input signals into the memory 400A can include an address bus 430, a control bus 440, some power supplies 450 (typically Vcc and ground—the other signals of bus 450 can be internally generated by the 1 MB memory 400A), and a data bus 460. The control bus 440 typically includes signals to select the chip, to signal whether a read or write operation should be performed, and to enable the output buffers when the chip is in read mode. The address bus 430 specifies which location in the memory array is accessed—some portion of the addresses go to the X block 470 (typically including a predecoder and an X-decoder) to select one line out of the horizontal array lines. The other portion of the addresses go to a Y block 480 (typically including a predecoder and a Y-decoder) to apply the appropriate voltage on specific vertical lines. Each memory bit block 405 operates on one line of the memory chip data bus 460.

The reading of data from the memory array layer 420 is relatively straightforward: an x-line is energized, and current is sensed by the sensing circuits 410 on energized y-lines. During a write operation, the data is applied from the data bus 460 to the input buffers and data drivers 490 to the selected lines.

Figure 4B:
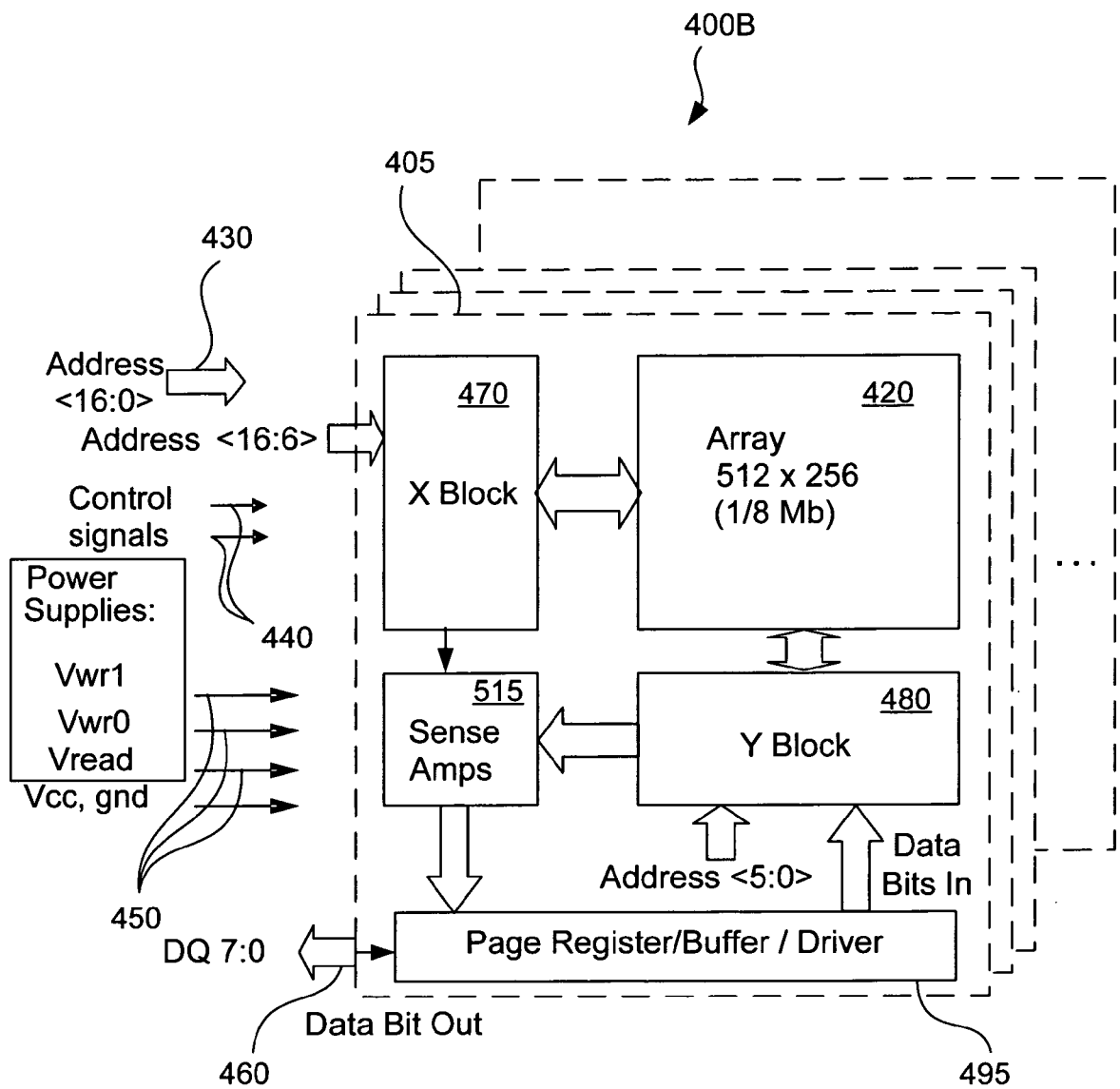
FIG. 4B depicts a block diagram of an exemplary memory that includes sensing circuits that are capable of reading multiple bits.

FIG. 4B is a block diagram of an exemplary memory 400B that includes sensing circuits 415 that are capable of reading multiple bits. The simultaneous reading of multiple bits involves sensing current from multiple y-lines simultaneously.

When binary information is sent to the memory chip 400B, it is stored in latch circuits within the circuits 495. Within the circuits 495, each y-line can either have an associated driver circuit or a group of y-lines can share a single driver circuit if the non-selected lines in the group are held to a constant voltage that would not cause the unselected memory plugs to experience any change in resistance. As an example, there may be 1024 y-lines in a cross point array, and the page register may include 8 latches, in which case the y-block would decode 1 out of 128 y-lines and connect the selected lines to block 495. The driver circuit then writes the 1 or 0 to the appropriate memory plug. The writing can be performed in multiple cycles. In a scheme described in PCT Patent Application No. PCT/US04/13836, filed May 3, 2004, incorporated herein by reference, all the is can be written during a first cycle and all the 0s can be written during a second cycle. As described below, certain memory plugs can have multiple stable distinct resistive states. With such multi-level resistance memory plugs, driver circuits could program, for example, states of /00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Array Usage

Figure 5:
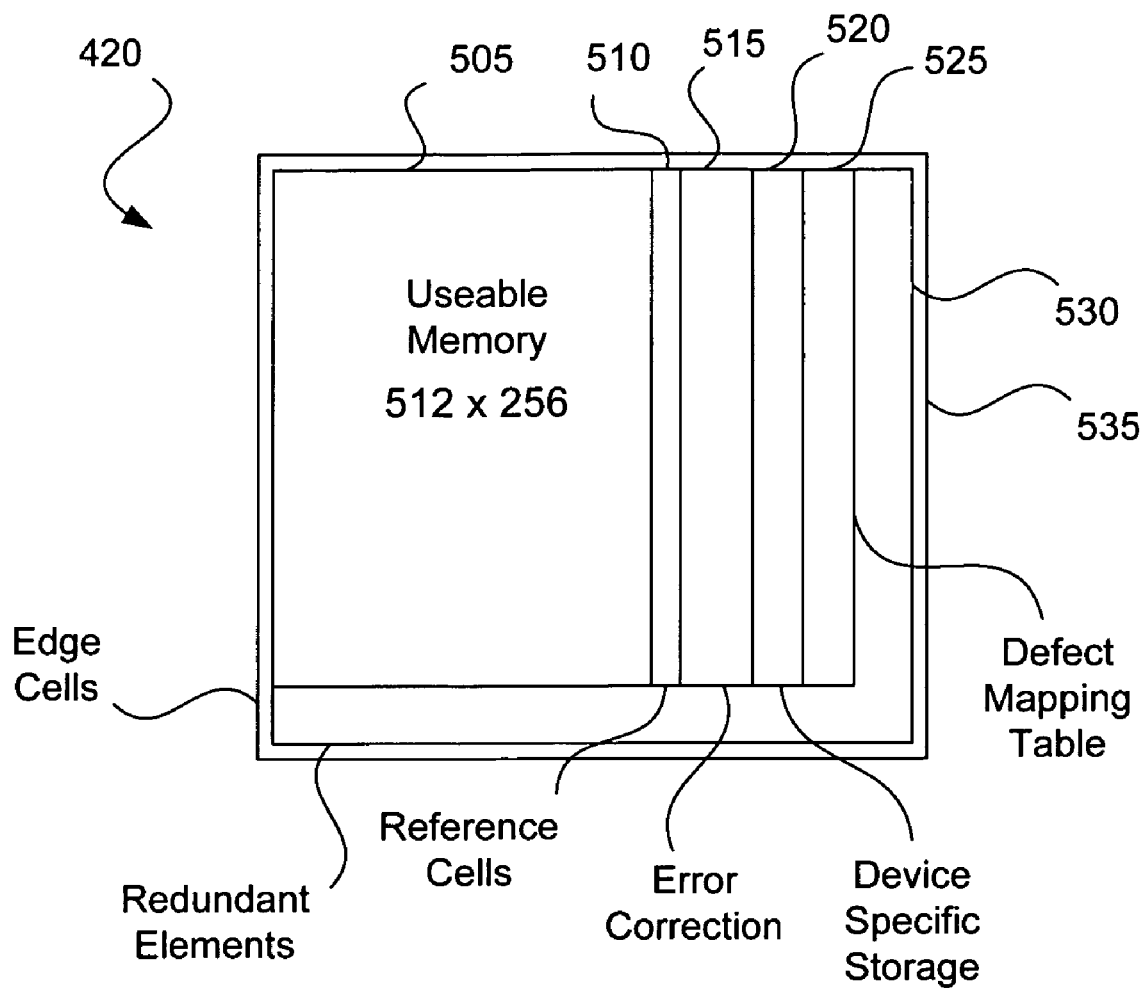
FIG. 5 depicts a block diagram showing various dedicated portions of the memory array.

FIG. 5 is a block diagram of the memory array layer 420 including portions devoted towards memory storage 505, reference 510, error correction 515, device specific storage 520, defect mapping tables 525, redundant elements 530, and edge cells 535. During "normal operation" (reading or writing of an identified address) the only section that external devices are able to directly access and program is the memory storage 505 section. Although the other sections are only accessible indirectly or through "special operations" (e.g., test modes used during manufacturing) they all contribute to enhanced functionality. In many cases a memory controller (not shown) will manage the enhanced functionality sections, reporting out to external devices only when special commands are received.

Reference cells, fully described in U.S. application Ser. No. 10/895,218, filed Jul. 20, 2004, now U.S. Pat. No. 7,075,817, titled "Two Terminal Memory Array Having Reference Cells," improve performance by providing a reference level to the system. Once the reference level is known, the resistance state of other memory cells can be determined by comparing their resistances to the known reference levels. The number of reference cells that are used in the reference portion 510 is a design choice that can vary from a single cell to several columns.

The device specific storage 520 is an area that can be devoted to data such as factory settings, internal variables that control and identify the memory, and defect mapping tables. Device serial numbers, product identifiers, counters and registers can all be stored in this area. Additionally, data that modifies various parameters, such as voltage levels, could also be stored in the device specific storage 520.

Some portions of the device specific storage 520 would only be modifiable by internal processes, and others might be capable of being externally modifiable. Typically, the portions of the device specific storage 520 that can be externally modified would require special addressing, perhaps by using special control signals.

Since the device specific storage 520 portion of the memory array layer 420 uses the same memory cells as every other portion of the array, they are typically fully reprogrammable. However, the manufacturer may not want certain variables (such as serial numbers and some factory presets) to be modifiable after the memory chip leaves the factory. Accordingly, certain protocols could be implemented to ensure they cannot be reprogrammed.

For example, circuitry could be used that only allows a specific memory cell in the device specific storage 520 to be programmed in one direction. Once this flag is programmed, the circuitry would not allow that memory cell to be reprogrammed. Whenever an operation is desired that writes to the protected variables, the system could check the state of a flag bit or bits, and then only allow information to be written when that bit is in its initial state. One of the last steps of the manufacturing process could then be to program the flag bit, ensuring future modification is impossible. Alternatively, other storage mechanisms, such as a one-time programmable floating gate, could be used as the flag. As yet another example of a way to prevent reprogramming, a logic circuit could ensure that protected variables are only written to when their previous state is zero (or some other initial value), eliminating the need for a flag, but preventing even the factory from altering the variables once it is programmed.

The error correction 515 portion of the memory array layer 420 could include a variety of schemes. For example, parity checking is a rudimentary method of detecting simple, single-bit errors. Typically parity checking requires one extra bit to be used for every byte of data.

When parity checking is used, each time a byte is written to memory, a logic circuit called a parity generator/checker examines the byte and determines whether the data byte had an even or an odd number of ones. As an example, if it has an even number of ones, the parity bit is set to a one; otherwise it is set to a zero. Therefore, no matter how many ones there were in the original data bits, there are always an odd number of ones when you look at all of the bits (including the parity bit) together. This is called odd parity. (It is also possible to have even parity, where the generator makes the sum always come out even.)

When the data is read back from memory, the parity circuit reads back all of the bits and determines again if there are an odd or an even number of ones. If there is an even number of ones, an error signal is generated. When a parity error is detected, the parity circuit typically generates what is called a "non-maskable interrupt" or "NMI," which is usually used to instruct the processor to immediately halt. This is done to ensure that the incorrect memory does not corrupt any calculations.

Although parity checking provides single-bit error detection for the system memory, it neither handles multi-bit errors nor provides any way to correct memory errors. An advanced error detection and correction protocol, called ECC, can be used to both detect multi-bit errors and correct single bit errors.

ECC (error correcting circuits, error correcting code, or error correction code) uses a special algorithm to encode information in a block of bits that contains sufficient detail to permit the recovery of a single bit error in the protected data. ECC typically uses larger groupings: 7 bits to protect 32 bits, or 8 bits to protect 64 bits.

The most commonly used ECC schemes will detect, but not correct, errors of 2, 3 or even 4 bits, in addition to detecting and correcting single-bit errors. ECC memory handles these multi-bit errors similarly to how parity handles single-bit errors: by using a non-maskable interrupt that instructs the system to shut down to avoid data corruption.

Unlike parity checking, ECC will typically cause a slight slowdown in system operation. The ECC algorithm is more complicated, and time must usually be allowed for ECC to correct any detected errors.

The above ECC is only one scheme that could be used. As is well known to information theorists and mathematicians, other error correction schemes such as Hamming code, Reed-Solomon code, Golay Code, sparse graph codes, turbo codes, and digital fountain codes could also be used.

Different ECC codes could be implemented in the same basic architectural design. If reliability is initially uncertain, a robust ECC could be used that uses many bits in the error correction 515 portion of the memory array layer 420. As reliability becomes more certain in later product generations, a less robust ECC could be used, possibly using a simple parity checking scheme. Accordingly, the portion of the memory array layer 420 devoted to error correction 515 could be decreased, and the capacity of the usable memory 505 portion could increase for later generations.

Errors can occur for many reasons. One reason may be that the physical array is damaged in some way that prevents normal operation. Physical problems are important to identify because they will continuously reoccur. Although ECC and/or parity can be used to track when certain cells are defective, other mechanisms are also possible. For example, if a certain set of bits requires multiple read retries, it can be indicative of a physical problem.

The defect mapping table 525 could either simply list the defective cells or map out the entire array. An array map may be used to identify patterns. For example, all the memory cells on a particular memory array layer line might be defective. It might be beneficial to simply identify an entire line as defective once a certain percentage of bad cells are detected on that line, instead of relying on the system to eventually determine each cell on that line is bad. Once a determination is made that a line is bad, the line may be held to an off state so as to reduce current flow in the defective rows or columns and lower the overall power of the device.

What the memory system does with the defect mapping table 525 is a design choice. Certain memory systems might simply report out the defect mapping table to the host system (or memory controller) and leave it up to that system to avoid the bad cells. Other memory systems might use redundant elements 530 to compensate for the bad cells. Entire rows, columns or planes may be replaced in order to reduce the peripheral circuitry needed to compensate for the bad cells.

If redundant elements 530 are used, the memory chip could transparently compensate for bad cells. As memory requests would come in, the peripheral circuitry would compare the associated address with addresses stored in the defect mapping table 525. If the defect mapping table 525 identifies a defective address, the peripheral circuitry would then look up the replacement address in the defect mapping table 525, and then redirect the request to appropriate memory cells in the redundant element 530 portion.

The physical layouts of the various portions 505, 510, 515, 520, 525, and 530 can vary from one design to the next. Regardless of the specific design, each physical array 420 might require a periphery of unused edge cells 535 to ensure that the functional cells in the array 420 have similar physical characteristics. Because of proximity effects, the cells at the edge of an array may not have the same exact dimensions as cells near the center of the array. By adding a ring of edge cells 535, this edge effect is reduced for the cells that are actually used in the array.

Figure 6A:
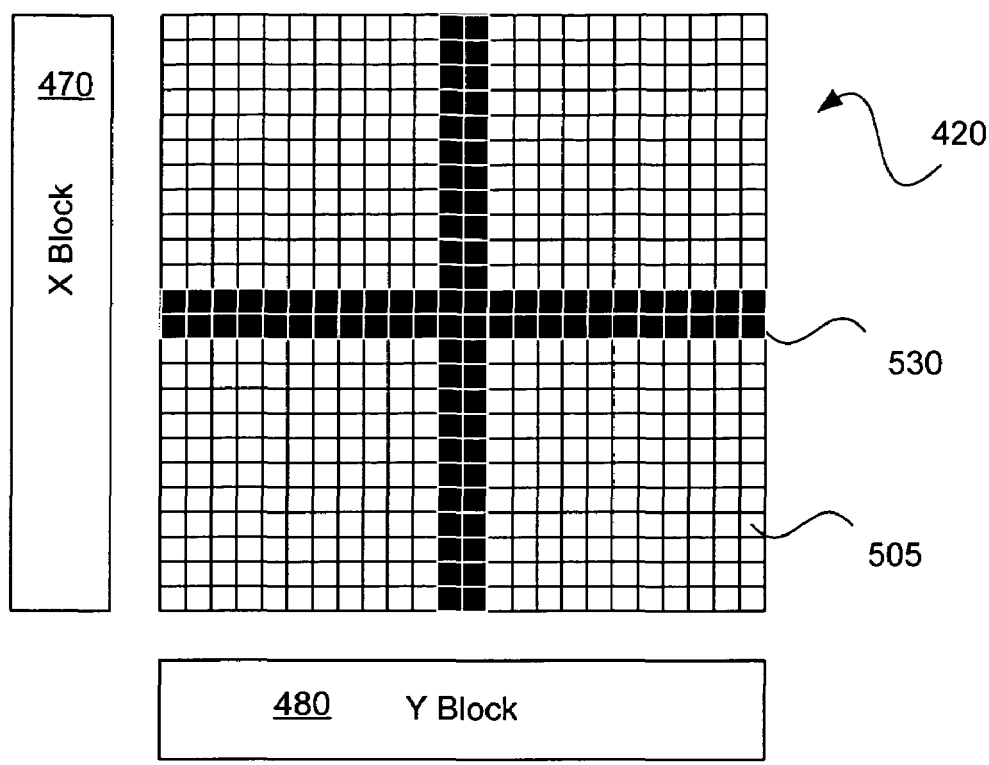
FIGS. 6A through 6D depict block diagrams showing various physical layouts of redundant elements in the memory array layer.

FIGS. 6A through 6D are block diagrams depicting various physical layouts of the redundant element 530 portion of the memory array layer 420. Although only the redundant element 530 portion is discussed, other portions can have similar layouts. In FIG. 6A the redundant element 530 portion is interleaved into the usable memory 505 portion. Such a layout can be most useful when each line of the memory array layer 420 is independently controlled.

Figure 6B:
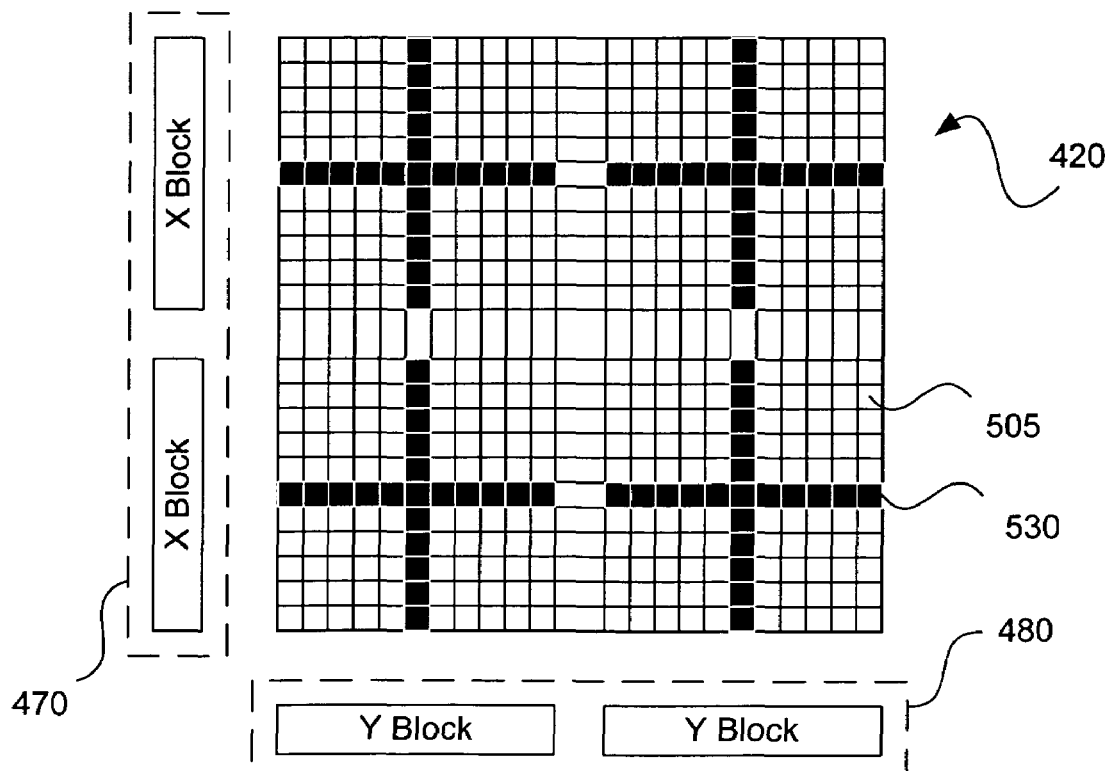

FIG. 6B depicts the memory array layer 420 in a sub-block configuration. Each sub-block is generally tied to distinct drivers and/or sensing circuitry such that they are accessed as a group. In certain architectures a single address would direct the system to access all four sub-blocks simultaneously. In order to reduce the peripheral circuitry that would be required to individually control the substitution of bad cells with redundant elements 530 of each sub-block, all the sub-blocks could be substituted as a group. Accordingly, an error requiring substitution in a single sub-block would cause all the sub-blocks to associate an address with the available redundant elements 530.

Figure 6C:
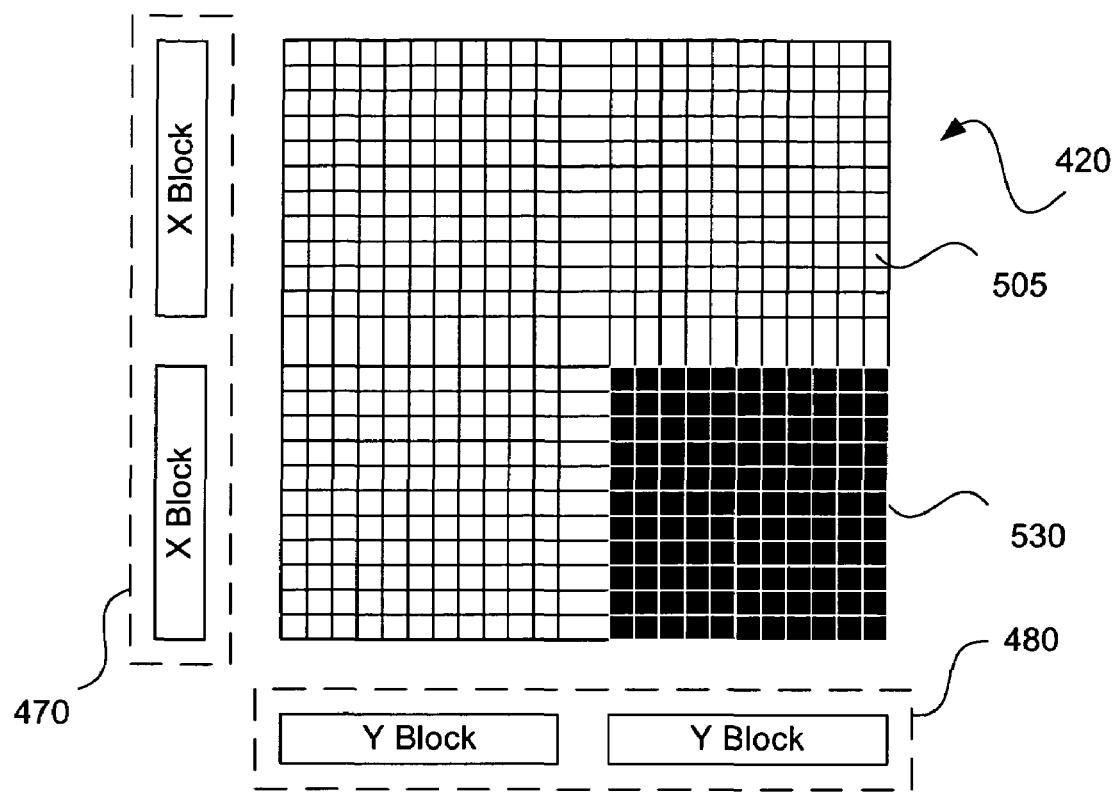

FIG. 6C depicts the memory array layer 420 in another sub-block configuration where an entire sub-block is devoted to the redundant elements 530.

Figure 6D:
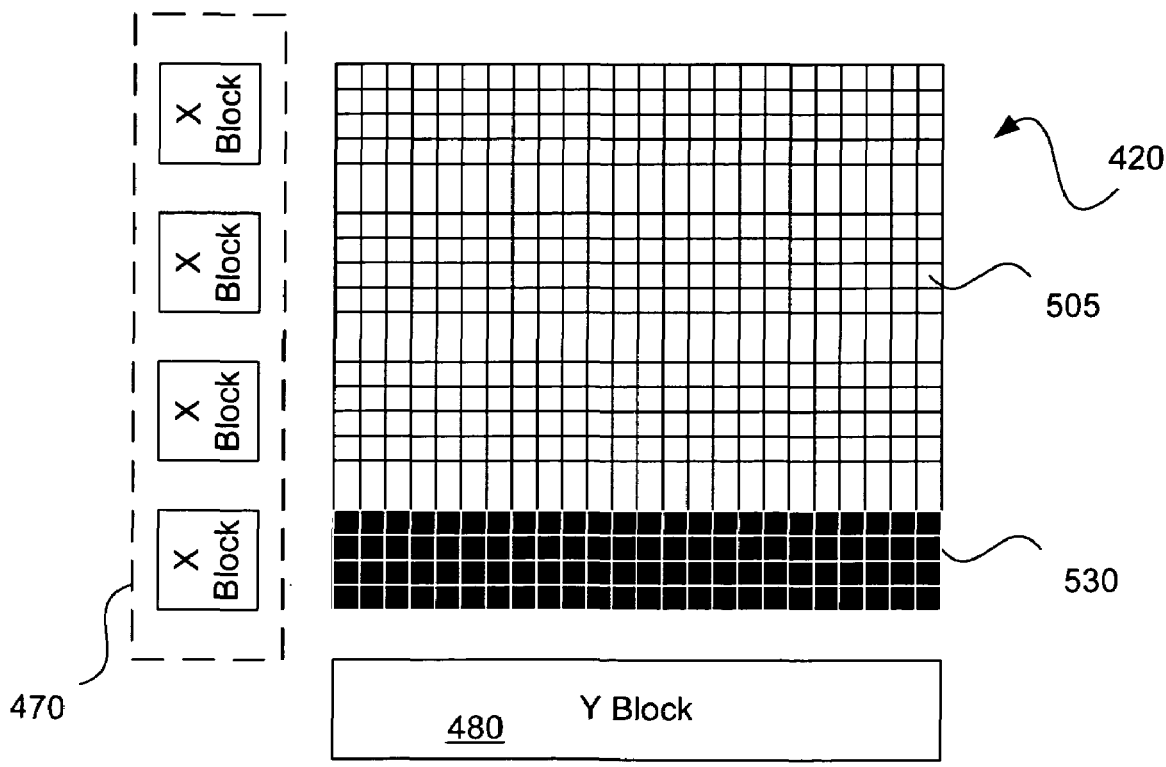

FIG. 6D depicts the memory array layer 420 in yet another sub-block configuration where an entire sub-block is devoted to the redundant elements 530. However, instead of the sub-blocks being quadrants, they are striated, which may be a preferable design in certain architectures.

Although FIGS. 6A through 6D describe layouts of a single memory array layer, multiple stacked memory array layers are possible. In alternative embodiments, the portions 505, 510, 515, 520, 525, and 530 may be distributed across the memory different ways.

Figure 7A:
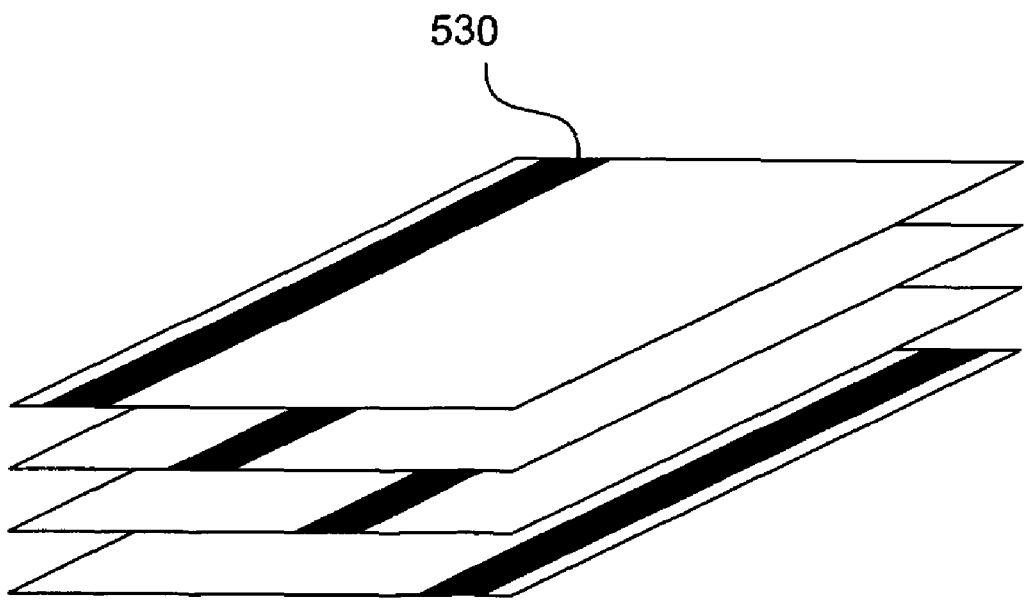
FIGS. 7A through 7F depict block diagrams showing various physical layouts of redundant elements in a stacked memory array.
Figure 7B:
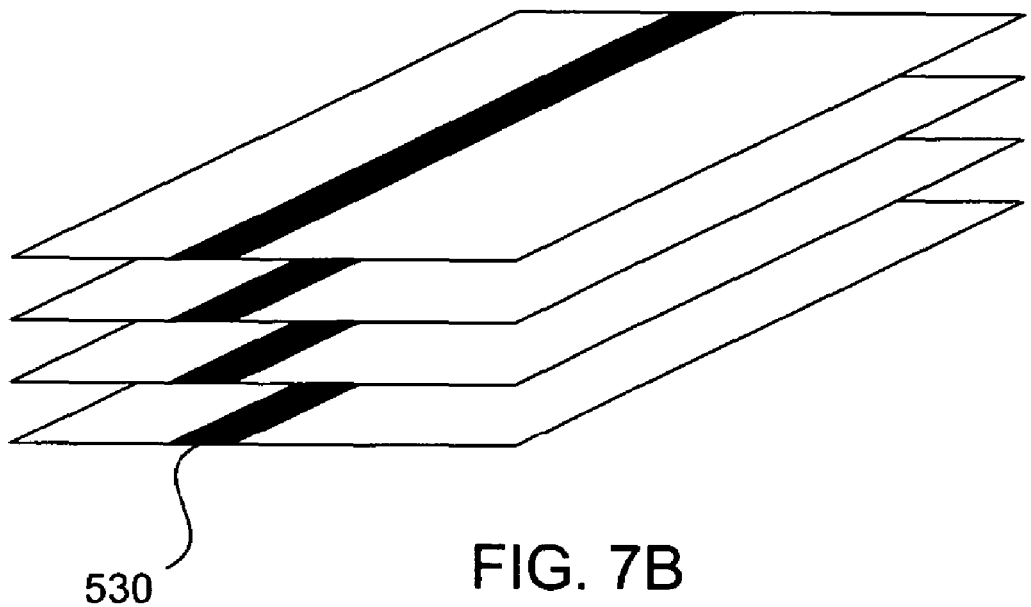

FIGS. 7A and 7B are block diagrams of redundant elements 530 being placed in a stacked memory array. Although only a y-direction of redundant elements 530 are shown in FIGS. 7A and 7B, x-direction redundant elements can have similar layouts. Additionally, such layouts are equally applicable to architectures that use redundant elements 530 in each sub-block. Both offsetting redundant elements 530 from one another, as in FIG. 7A, and vertically lining up redundant elements, as in FIG. 7B, have advantages, and, if desired, both can be used in a single memory.

Certain defects may propagate vertically through the planes such that all memory planes will share common defect rows and columns. Just as it might be beneficial to identify an entire line as defective once a certain percentage of bad cells are detected on that line, it can also be beneficial to identify groupings of vertical cells as bad once a certain percentage of bad cells are detected in that grouping.

If the memory chip allows for three dimensional defect detection, it is generally easier to design a circuit that replaces a group of vertically aligned defective cells with a group of vertically aligned redundant elements 530, as in FIG. 7B. However, either design is viable.

Figure 7C:
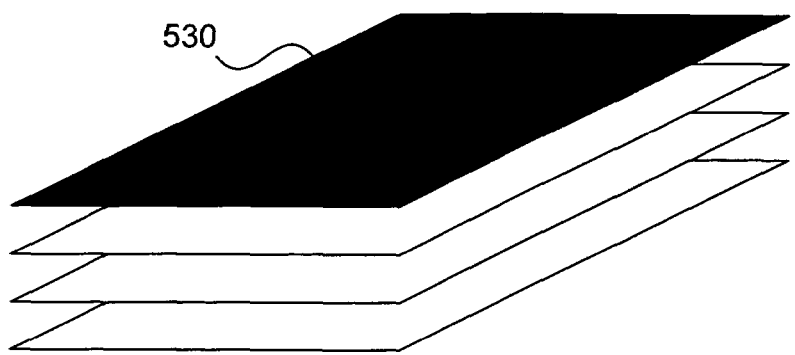
Figure 7D:
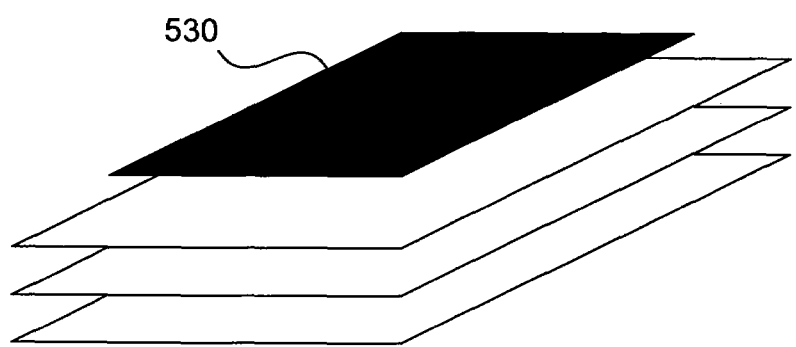
Figure 7E:
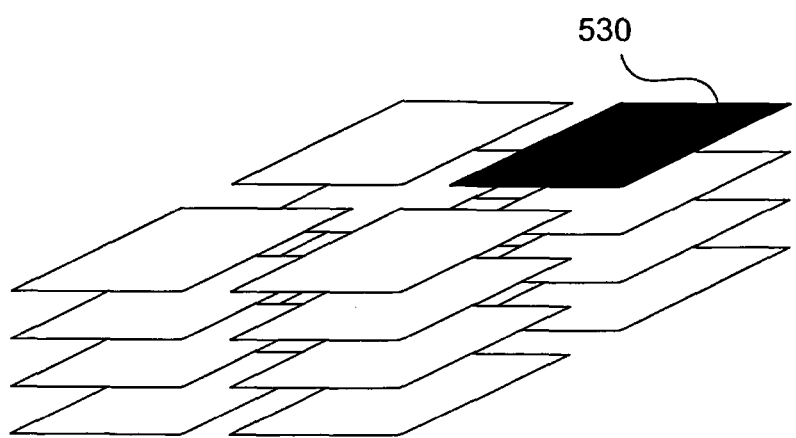

FIG. 7C depicts a block diagram of the redundant elements 530 of a stacked memory having an entire layer dedicated to the redundant elements 530. However, an entire layer may not be needed. Even if the other portions 510, 515, 520, and 525 used the same layer, any entire layer may still be more than is required. One solution might be to use a physically smaller layer, as shown in FIG. 7D. Another technique that may ensure potentially usable memory 505 is not wasted is to use sub-blocks. FIG. 7E depicts a block diagram of stacked memories having a sub-block configuration with less than all the sub-blocks on a layer being devoted to the redundant elements 530.

Figure 7F:
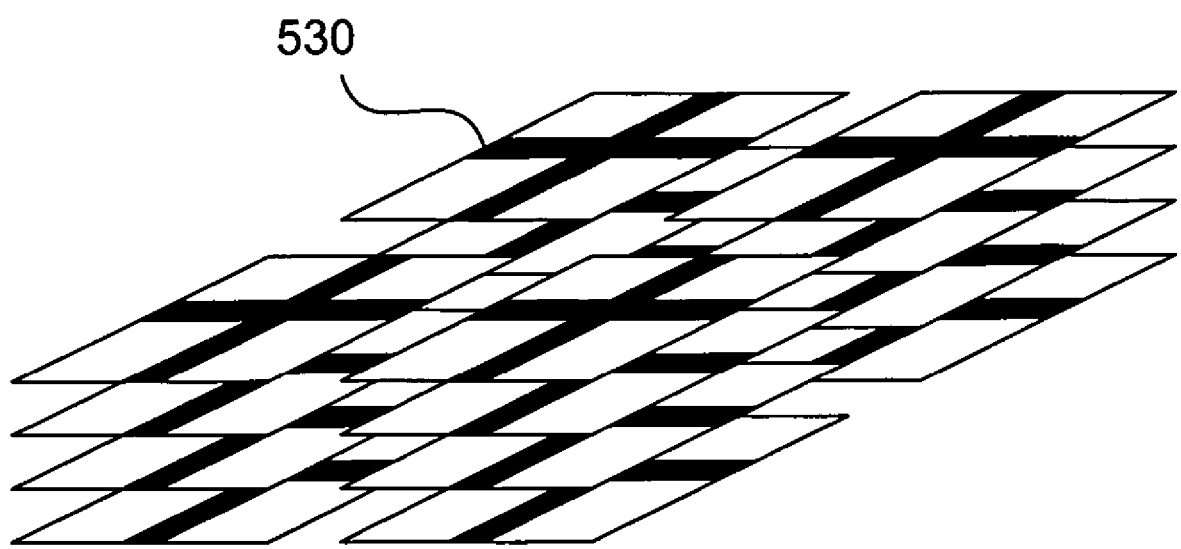

FIG. 7F depicts a block diagram of stacked memories in a sub-block configuration with a symmetrical layout of the redundant elements 530. In such architectures all sub-blocks across all layers might be accessed in parallel. Every address might point to the same relative location in every sub-block. Accordingly, in scheme similar to that described in FIG. 6B, the peripheral circuitry required to make substitutions with the redundant elements 530 might be reduced by having all sub-blocks make the same substitution when an error in a single sub-block is detected.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If a selected x-direction conductive array line carried ½ $V_W$, and a selected y-direction conduction array line carried –½ $V_W$, the current path would be the memory plug at the intersection of the two conductive array lines such that the memory plug experienced a total voltage drop of $V_W$. The other memory plugs would exhibit such high resistances from the non-ohmic characteristic that current would not flow through the half-selected plugs.

Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs (e.g., as a pair of electrodes sandwiching the memory element). If the only purpose of the electrodes is to act as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various other functions, including: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

The "memory element electrodes" are the electrodes (or, in certain circumstances, the portion of the conductive array lines) that the memory elements are sandwiched in-between. As used herein, memory element electrodes are what allow other components to be electrically connected to the memory element. It should be noted that in both cross point arrays and transistor memory arrays have exactly two memory element electrodes since the memory plug has exactly two terminals, regardless of how many terminals the memory cell has. Those skilled in the art will appreciate that a floating gate transistor, if used as a memory element, would have exactly three memory element electrodes (source, drain and gate).

Memory Effect

The memory effect is a hysteresis that exhibits a resistive state change upon application of a voltage while allowing non-destructive reads. A non-destructive read means that the read operation has no appreciable effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. It should be appreciated that the magnitude of $|-V_W|$ does not necessarily equal the magnitude of $|+V_W|$.

Furthermore, it is possible to have a memory cell that can be switched between resistive states with voltages of the same polarity. For example, in the paper "The Electroformed metal-insulator-metal structure: a comprehensive model," by R. E. Thurstans and D. P. Oxley 35 J. Phys. D. Appl. Phys. 802-809, incorporated herein by reference for all purposes, describes a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a value of 10 kΩ to 100 kΩ. If the $R_1$ state resistance is less than 10 kΩ, the current consumption will be increased because the cell current is high, and the parasitic resistances may have a larger effect. If the $R_1$ state value is much above 100 kΩ, the RC delays may increase access time. However, workable single state resistive values may also be achieved with resistances as low as 5 kΩ and as high as 1 MΩ in certain applications. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is an example of a technique for implementing multi-bit memory as fast as a single-bit memory. For example, a memory cell that is capable of storing three resistive states might have the low resistive state be separated from the high resistive state by a factor of 100. A memory cell that is capable of storing two bits of information (four resistive states) might require the low resistive state be separated from the high resistive state by a factor of 1000.

Creating the Memory Effect

Mechanisms for creating the memory effect have been discussed in various papers, patents and patent applications. For example, U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, discloses resistive cross point memory devices along with methods of manufacture and use. The memory device comprises an active layer of perovskite material interposed between upper electrodes and lower electrodes. Similarly, U.S. Pat. No. 6,473,332, entitled "Electrically Variable Multi-State Resistance Computing" by Ignatiev et al, incorporated herein by reference for all purposes, discloses resistive memory devices using colossal magnetoresistive oxides. Other types of materials may also be useful, such as the phase change materials described in U.S. Pat. No. 5,296,716 entitled "Electrically Erasable, Directly Overwritable, Multibit Single Cell Memory Elements and Arrays Fabricated Therefrom" by Ovshinsky et al, incorporated herein by reference for all purposes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

Additionally, various co-pending applications also discuss methods for creating a memory effect, including: U.S. application Ser. No. 10/604,606, filed Aug. 4, 2003, now U.S. Pat. No. 7,071,008, titled "Multi-Resistive State Material That uses Dopants"; U.S. application Ser. No. 10/634,636, filed Aug. 4, 2003, now U.S. Pat. No. 7,038,935, titled "A 2-Terminal Trapped Charge Memory Device with Voltage Switchable Multi-Level Resistance"; U.S. application Ser. No. 10/682,277, filed Oct. 8, 2003, now U.S. Pat. No. 7,067,862, titled "Conductive Memory Device with Barrier Electrodes"; U.S. application Ser. No. 10/605,757, filed Oct. 23, 2003, now U.S. Pat. No. 6,965,137, titled "Multi-Layer Conductive Memory Device"; U.S. application Ser. No. 10/665,882, filed Sep. 19, 2003, titled "Resistive Memory Device with a Treated Interface"; U.S. application Ser. No. 10/773,549, filed Feb. 6, 2004, now U.S. Pat. No. 7,082,052, titled "Multi-Resistive State Element With Reactive Metal"; U.S. application Ser. No. 10/868,578, filed Jun. 15, 2004, now U.S. Pat. No. 6,972,985, titled "Memory Element Having Islands"; and U.S. application Ser. No. 10/934,951, filed Sep. 3, 2004, titled "Memory Using Variable Tunnel Barrier Widths"; all of which are hereby incorporated by reference in their entireties and for all purposes. Accordingly, a change in resistivity or resistive states could be accomplished by any number of mechanisms.

CONCLUDING REMARKS

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claims.

What is claimed is:

1. An apparatus comprising:
a plurality of cells, each cell having a pair of conductive electrodes wherein applying a read voltage across the pair of conductive electrodes is useful to generate a read current, the read current being indicative of a stored data value, and wherein applying a first write voltage across the pair of conductive electrodes is effective to store a first data value and applying a second write voltage across the pair of conductive electrodes is effective to store a second data value, the storage of the first and second data values being nonvolatile;
wherein the plurality of cells has a usable portion that is directly accessed and programmed during normal operation and at least one enhanced functionality portion that is only accessed indirectly or during special operations.

2. The apparatus of claim 1 wherein the at least one enhanced functionality portion of cells is a reference portion that provides a reference level, the reference level being compared to the usable portion of cells.

3. The apparatus of claim 1 wherein the at least one enhanced functionality portion of cells is an error correction portion that contributes to error detection.

4. The apparatus of claim 3 wherein the error correction portion includes cells used for parity bits.

5. The apparatus of claim 3 wherein the error correction portion contributes to correcting errors once the errors are detected.

6. The apparatus of claim 1 wherein the at least one enhanced functionality portion of cells is a defect mapping table.

7. The apparatus of claim 6 wherein the defect mapping table is useful for detecting error patterns in columns and rows.

8. The apparatus of claim 7 wherein the plurality of cells are arranged in a stacked cross point array pattern and the defect mapping table is useful for detecting error patterns in three dimensions.

9. The apparatus of claim 1 wherein the at least one enhanced functionality portion of cells is a device specific storage.

10. The apparatus of claim 9 wherein the device specific storage is capable of being protected from any further modification.

11. The apparatus of claim 1 wherein the at least one enhanced functionality portion of cells is for redundancy.

12. An apparatus comprising:
a plurality of cells, each cell having a pair of memory element electrodes; wherein a read current across the pair of memory element electrodes is indicative of stored information; and wherein different write voltages across the pair of memory element electrodes are employed to store nonvolatile reprogrammable information;
wherein the plurality of cells has at least one enhanced functionality portion that is useful in connection with operations selected from the group consisting of reference, error correction, device specific storage, defect mapping tables, and redundancy.

13. The apparatus of claim 12 wherein the cells have a usable portion that is directly accessed, the usable portion being arranged in sub-blocks.

14. The apparatus of claim 13 wherein the sub-blocks are accessed in parallel such that a single address accesses several sub-blocks.

15. The apparatus of claim 14 wherein the at least one enhanced functionality portion is useful in connection with redundancy operations and is distributed across several sub-blocks.

16. The apparatus of claim 15 wherein:
the usable portion is directly accessed with an address, each address being associated with a relative location within each of the several sub-blocks;
within the several sub-blocks, the relative locations of the at least one enhanced functionality portion that is useful in connection with redundancy operations are the same;
the at least one enhanced functionality portion that is useful in connection with redundancy operations is, when redundancy operations are utilized, associated with an address that would otherwise be associated with the usable portion, whereby associating an address causes all the relative locations within each of the several sub-blocks associated with that address to be changed.

17. The apparatus of claim 12 wherein the plurality of cells are arranged in a stacked cross point array.

18. An apparatus comprising:
address lines operable to carry addresses;
control lines operable to carry control signals that include a write enable signal and a read enable signal;
data lines operable to carry data;
an address decoder that decodes the address on the address lines and activates certain array lines;
drivers that, as a function of the control signals, are operative to cause some array lines to be placed at different voltages; and
a plurality of cells, each cell being accessed by the array lines and each cell having a pair of memory element electrodes; wherein a read current across the pair of memory element electrodes is indicative of stored data; and wherein a first write voltage across the pair of memory element electrodes is effective to store a first data value and a second write voltage across the pair of memory element electrodes is effective to store a second data value;
wherein a portion that includes less than all of the plurality of cells are directly accessible when the control signals are indicative of either a write enable or a read enable signal.

* * * * *